(12) United States Patent
Nakazawa et al.

(10) Patent No.: US 10,128,363 B2
(45) Date of Patent: Nov. 13, 2018

(54) FIELD EFFECT TRANSISTOR (71) Applicant: Panasonic Intellectual Property Management Co., Ltd., Osaka (JP)

(72) Inventors: Satoshi Nakazawa, Osaka (JP); Tetsuzo Ueda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 176 days.

(21) Appl. No.: 14/736,665

(22) Filed: Jun. 11, 2015

(65) Prior Publication Data

US 2015/0311329 A1 Oct. 29, 2015

Related U.S. Application Data

(63) Continuation of application No. PCT/JP2013/006447, filed on Oct. 31, 2013.

(30) Foreign Application Priority Data

Dec. 20, 2012 (JP) ................................. 2012-278603

(51) Int. Cl.
*H01L 29/00* (2006.01)
*H01L 29/778* (2006.01)
(Continued)

(52) U.S. Cl.
CPC .... *H01L 29/7781* (2013.01); *H01L 29/42364* (2013.01); *H01L 29/66462* (2013.01);
(Continued)

(58) Field of Classification Search
CPC ............. H01L 29/7781; H01L 29/7786; H01L 29/7789; H01L 29/66462; H01L 29/205;
(Continued)

(56) References Cited

U.S. PATENT DOCUMENTS 6,429,467 B1 * 8/2002 Ando .................. H01L 29/7787
257/194
2002/0139995 A1 * 10/2002 Inoue .................. H01L 29/7783
257/194

(Continued)

FOREIGN PATENT DOCUMENTS

JP 2007-158143 6/2007
JP 2007-165431 6/2007

(Continued)

OTHER PUBLICATIONS

International Search Report of PCT application No. PCT/JP2013/006447 dated Feb. 4, 2014.

(Continued)

*Primary Examiner* — Dale E Page
*Assistant Examiner* — Quovaunda V Jefferson
(74) *Attorney, Agent, or Firm* — McDermott Will & Emery LLP (57) ABSTRACT

Provided is a field-effect transistor (FET) that achieves compatibility between a higher current density and lower contact resistance and exhibits excellent properties, and a method for producing the FET. The FET includes: a channel layer above a substrate; an InAlN layer above the channel layer; an $In_xAl_yGa_{1-(x+y)}N$ layer on the InAlN layer, where $0<x<1$, $0<y<1$, and $x+y<1$; and a source electrode and a drain electrode formed on the $In_xAl_yGa_{1-(x+y)}N$ layer.

19 Claims, 9 Drawing Sheets

(51) Int. Cl.
  *H01L 29/66*    (2006.01)
  *H01L 29/423*   (2006.01)
  *H01L 29/20*    (2006.01)
  *H01L 29/205*   (2006.01)
  *H01L 29/417*   (2006.01)
  *H01L 29/51*    (2006.01)
  *H01L 29/10*    (2006.01)

(52) U.S. Cl.
  CPC ...... *H01L 29/7786* (2013.01); *H01L 29/7789* (2013.01); *H01L 29/1066* (2013.01); *H01L 29/2003* (2013.01); *H01L 29/205* (2013.01); *H01L 29/41766* (2013.01); *H01L 29/4236* (2013.01); *H01L 29/42316* (2013.01); *H01L 29/517* (2013.01)

(58) Field of Classification Search
  CPC ........... H01L 29/42364; H01L 29/2003; H01L 29/42316; H01L 29/517; H01L 29/1066; H01L 29/4263; H01L 29/41766; H01L 29/4236
  See application file for complete search history.

(56) References Cited

U.S. PATENT DOCUMENTS

| | | | | |
|---|---|---|---|---|
| 2009/0146186 A1* | 6/2009 | Kub | ................... | H01L 29/1602 257/194 |
| 2010/0025730 A1 | 2/2010 | Heikman et al. | | |
| 2010/0155780 A1 | 6/2010 | Machida et al. | | |
| 2010/0270559 A1 | 10/2010 | Ota | | |
| 2011/0227093 A1 | 9/2011 | Hikita et al. | | |
| 2011/0263102 A1 | 10/2011 | Heikman et al. | | |
| 2011/0278644 A1 | 11/2011 | Gao et al. | | |
| 2012/0091522 A1* | 4/2012 | Ozaki | ................... | H01L 23/291 257/330 |
| 2012/0217546 A1 | 8/2012 | Machida et al. | | |
| 2012/0235160 A1 | 9/2012 | Heikman et al. | | |
| 2012/0315742 A1* | 12/2012 | Yui | ................... | H01L 21/02458 438/478 |
| 2013/0099285 A1 | 4/2013 | Hwang et al. | | |

FOREIGN PATENT DOCUMENTS

| | | |
|---|---|---|
| JP | 2009-049288 | 3/2009 |
| JP | 2010-135641 | 6/2010 |
| JP | 2010-147387 | 7/2010 |
| JP | 2011-238931 | 11/2011 |
| JP | 2011-529639 | 12/2011 |
| JP | 2013-089973 | 5/2013 |
| WO | 2009/066434 | 5/2009 |

OTHER PUBLICATIONS

Nakazawa et al., "Recessed-Gate AlGaN/GaN HFETs With Lattice-Matched InAlGaN Quaternary Alloy Capping Layers", IEEE Transactions on Electron Devices, vol. 52, No. 10, Oct. 2005, p. 2124-2128.

* cited by examiner

FIELD EFFECT TRANSISTOR

BACKGROUND OF THE INVENTION

1. Field of the Invention

The present disclosure relates to a field-effect transistor (FET) including a group-III nitride semiconductor, and a method for producing the FET.

2. Description of the Related Art

Group-III nitride semiconductors ($In_xAl_yGa_{1-(x-y)}N$ ($0 \leq x \leq 1$, $0 \leq y \leq 1$) hereinafter also referred to as InAlGaN) represented by gallium nitride (GaN) have a larger band gap (for example, GaN has 3.4 eV at a room temperature), a higher breakdown voltage, and a higher saturation voltage. Thus, the group-III nitride semiconductors have been receiving attention as materials for radio frequency devices or high power switching devices. For example, a heterojunction structure (hereinafter referred to as an AlGaN/GaN heterostructure) of a laminate in which an AlGaN layer is laminated above a GaN layer results in a high polarization field on the (0001) plane of the GaN layer. Thereby, electrons are highly accumulated near the heterojunction in the GaN layer without adding impurities to the GaN layer, that is, a two dimensional electron gas (2DEG) is formed.

GaN materials have a higher saturated drift velocity, for example, a drift velocity two or more times higher than those of GaAs materials that are currently widespread as materials for high-frequency transistors in a high electric field region of approximately $1 \times 10^5$ V/cm. Thus, FETs of the AlGaN/GaN heterostructure can achieve a higher current density.

Instead of AlGaN layers in the AlGaN/GaN heterostructure, an InAlN/GaN heterostructure including an InAlN layer has also been proposed to achieve a higher current density. $In_xAl_yN$ lattice-matches GaN when x=0.17, that is, x:y=0.17:0.83. Here, $In_xAl_yN$ has a band gap of approximately 4.7 eV that is larger than that of $Al_zGa_{(1-z)}N$ (3.6 eV to 4.3 eV, where z ranges from 0.1 to 0.4) that is generally used. Thus, FETs of the InAlN/GaN heterostructure including the InAlN layer instead of the AlGaN layer have a higher conduction band discontinuity ($\Delta E_c$) at the heterojunction between the InAlN and GaN layers, and thus electrons are highly confined. Furthermore, InAlN has spontaneous polarization higher than that of AlGaN. According to these features, the FETs of the InAlN/GaN heterostructure can form a 2DEG in extremely high concentration, and achieve a higher current density.

On the other hand, one of the problems of transistors containing GaN materials is higher contact resistance. Particularly, InAlN surfaces tend to have higher contact resistance due to a larger band gap of InAlN as described above. Thus, some propose techniques for reducing the contact resistance (for example, see Japanese Unexamined Patent Application Publication No. 2007-165431 (hereinafter referred to as Patent Literature (PTL) 1).

Figure 9:
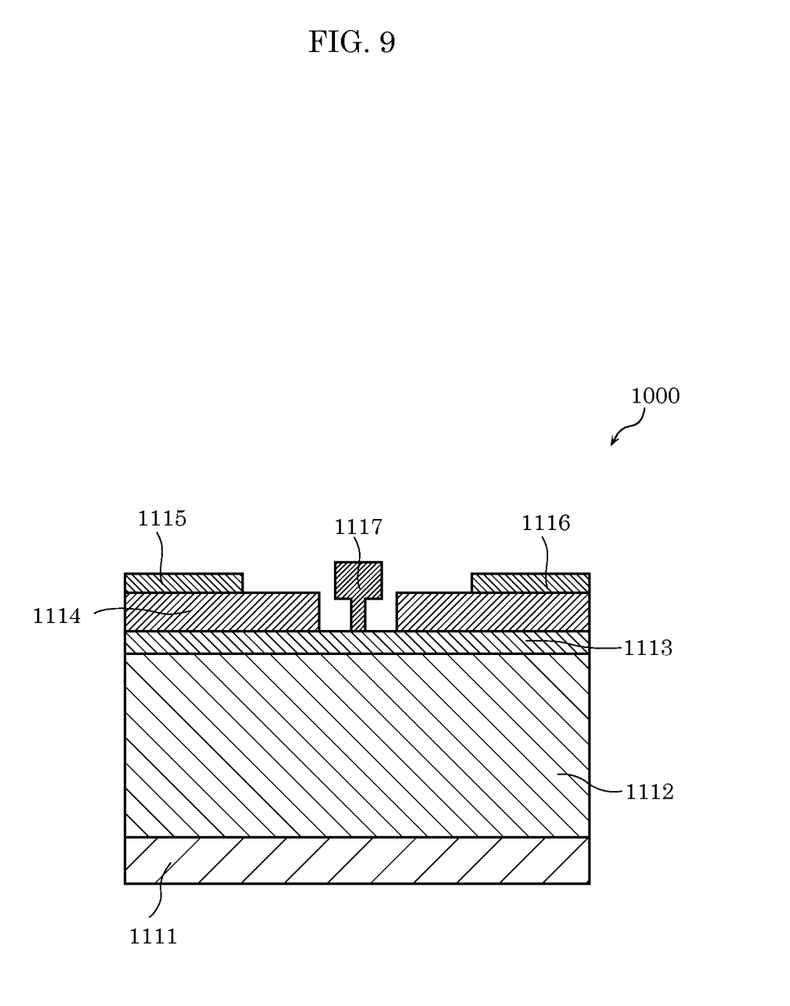
FIG. 9 is a cross-sectional view of a structure of a conventional FET.

As illustrated in FIG. 9, FET 1000 of PTL 1 includes in this order from the bottom to the top: substrate 1111; electron transport layer 1112; barrier layer 1113 containing InAlN; cap layer 1114 containing at least one of InGaN, InN, and GaN; and source electrode 1115 and drain electrode 1116 that are ohmic electrodes. Furthermore, gate electrode 1117 is formed above cap layer 1114. This structure enables FET 1000 to achieve a desired ohmic contact, and reduces the contact resistance.

SUMMARY OF THE INVENTION

The barrier between barrier layer 1113 and cap layer 1114 is so high that the contact resistance cannot be sufficiently reduced in FET 1000 according to PTL 1. Furthermore, cap layer 1114 has an amount of polarity smaller than that of barrier layer 1113. Since the interface between these layers is depleted and the barrier in-between further increases, it is difficult to reduce the contact resistance.

The present disclosure is to solve such technical problems, and provides a FET that achieves compatibility between a higher current density and lower contact resistance, and exhibits excellent properties.

In order to solve the problems, the field-effect transistor according to an aspect of the present disclosure includes: a GaN layer above a substrate; an InAlN layer above the GaN layer; an $In_xAl_yGa_{1-(x+y)}N$ layer on the InAlN layer, where $0<x<1$, $0<y<1$, and $x+y<1$; and ohmic electrodes on the $In_xAl_yGa_{1-(x+y)}N$ layer.

The FET with such a structure can obtain a higher current density by the polarization of the InAlN layer, produce a good ohmic contact by the InAlGaN layer having a smaller band gap and a higher electron affinity than the InAlN layer, and reduce the difference in amount of polarity between the InAlN layer and the InAlGaN layer. Thus, since the parasitic resistance at the interface between the InAlN layer and the InAlGaN layer can be maintained, the contact resistance can be reduced.

Furthermore, the field-effect transistor may further include a gate electrode over the $In_xAl_yGa_{1-(x+y)}N$ layer, wherein the GaN layer may be in contact with the $In_xAl_yGa_{1-(x+y)}N$ layer in a region below the gate electrode.

Furthermore, the FET with such a structure can achieve compatibility between a higher current density and lower contact resistance. In addition, a threshold value of the FET can be more easily controlled than forming the gate electrode over the InAlN layer having a larger amount of polarity.

Furthermore, the field-effect transistor may further include an AlN layer between the InAlN layer and the GaN layer.

The FET with such a structure can obtain a higher current density with higher electron mobility.

Furthermore, x of the $In_xAl_yGa_{1-(x+y)}N$ layer may increase with an increase in distance from the InAlN layer.

The FET with such a structure can maintain the parasitic resistance at the interface between the InAlN layer and the InAlGaN layer, and reduce the band gap of the InAlGaN layer and increase the electron affinity of the InAlGaN layer at the interface between the InAlN layer or the InAlGaN layer and the ohmic electrode. Thus, the FET can reduce the contact resistance.

Furthermore, the field-effect transistor according to another aspect of the present disclosure includes: a GaN layer above a substrate; an $In_xAl_yGa_{1-(x+y)}N$ layer above the GaN layer, where $0<x<1$, $0<y<1$, and $x+y<1$; an InAlN layer on the $In_xAl_yGa_{1-(x+y)}N$ layer; and ohmic electrodes on the $In_xAl_yGa_{1-(x+y)}N$ layer.

The FET with such a structure can produce a good ohmic contact by the InAlGaN layer having a smaller band gap and a higher electron affinity than the InAlN layer, and obtain a higher current density by the polarization of the InAlN layer.

Furthermore, the InAlN layer may have an opening, and the field-effect transistor may further include a gate electrode over a portion of the $In_xAl_yGa_{1-(x+y)}N$ layer that is exposed through the opening.

The FET with such a structure can obtain a higher current density by the polarization of the InAlN layer. In addition, a threshold value of the FET can be more easily controlled with the composition of the InAlGaN layer. Accordingly, the FET having excellent properties can be prepared.

Furthermore, the field-effect transistor may further include an AlN layer between the GaN layer and the $In_xAl_yGa_{1-(x+y)}N$ layer.

The FET with such a structure can obtain a higher current density with higher electron mobility.

Furthermore, the InAlN layer and the $In_xAl_yGa_{1-(x+y)}N$ layer may have an opening, and the field-effect transistor may further include: a first semiconductor layer on the GaN layer that is exposed through the opening, the first semiconductor layer comprising a material having an amount of polarity smaller than an amount of polarity of the $In_xAl_yGa_{1-(x+y)}N$ layer; and a gate electrode above the first semiconductor layer.

Furthermore, the FET with such a structure can achieve compatibility between a higher current density and lower contact resistance. In addition, a threshold value of the FET can be more easily controlled than forming a gate electrode over the InAlN layer having a larger amount of polarity.

Furthermore, the field-effect transistor may further include a second semiconductor layer between the first semiconductor layer and the gate electrode, the second semiconductor layer having a p-type conductivity.

Such a structure can achieve an enhancement-mode FET required by power devices.

Furthermore, the first semiconductor layer may comprise AlGaN.

Furthermore, the second semiconductor layer may comprise GaN.

Furthermore, the field-effect transistor may further include an insulating film between the first semiconductor layer and the gate electrode.

Such a structure can achieve a FET that can reduce the leakage current using the gate electrode and that has excellent properties.

Furthermore, the field-effect transistor may further include an insulating film between the second semiconductor layer and the gate electrode.

Such a structure can achieve a FET that can reduce the leakage current using the gate electrode and that has excellent properties.

Furthermore, the InAlN layer and the $In_xAl_yGa_{1-(x+y)}N$ layer may have an opening, and the field-effect transistor may further include a gate electrode and an insulating film, the gate electrode being disposed through the insulating film above the GaN layer that is exposed through the opening.

Such a structure enables a FET to achieve compatibility between a higher current density and lower contact resistance, and can achieve an enhancement-mode FET having a smaller leakage current in the gate electrode.

Furthermore, the InAlN layer may lattice-match the GaN layer.

Such a structure can achieve a FET having excellent properties with higher crystallizability.

Furthermore, the $In_xAl_yGa_{1-(x+y)}N$ layer may satisfy $y>4.6x$.

Since such a structure can increase the amount of polarity of the $In_xAl_yGa_{1-(x+y)}N$ layer, the difference in amount of polarity with the InAlN layer can be reduced, and the barrier at the interface between the InAlN layer and the InAlGaN layer can be lowered. Accordingly, the contact resistance of the FET can be reduced.

In order to solve the problems, the method for producing a field-effect transistor according to an aspect of the present disclosure includes: forming a GaN layer above a substrate; forming an InAlN layer above the GaN layer; forming a gate recess portion by partly removing the GaN layer and the InAlN layer; forming an $In_xAl_yGa_{1-(x+y)}N$ layer on the InAlN layer, where $0<x<1$, $0<y<1$, and $x+y<1$; forming ohmic recess portions; forming ohmic electrodes on the ohmic recess portions; and forming a gate electrode over the ohmic recess portions.

The FET with such a structure can obtain a higher current density by the polarization of the InAlN layer, produce a good ohmic contact by the InAlGaN layer having a smaller band gap and a higher electron affinity than the InAlN layer, and reduce the difference in amount of polarity between the InAlN layer and the InAlGaN layer. Thus, since the parasitic resistance at the interface between the InAlN layer and the InAlGaN layer can be maintained, the contact resistance can be reduced.

Furthermore, the method may further include forming the $In_xAl_yGa_{1-(x+y)}N$ layer in contact with the GaN layer, after the forming of a gate recess portion.

Furthermore, the FET with such a structure can achieve compatibility between a higher current density and lower contact resistance. In addition, a threshold value of the FET can be more easily controlled than forming the gate electrode over the InAlN layer having a larger amount of polarity.

Furthermore, the method may further include forming an AlN layer between the forming of a GaN layer and the forming of an InAlN layer.

The FET with such a structure can obtain a higher current density with higher electron mobility.

Furthermore, the method for producing a field-effect transistor according to another aspect of the present disclosure includes: forming a GaN layer above a substrate; forming an $In_xAl_yGa_{1-(x+y)}N$ layer above the GaN layer, where $0<x<1$, $0<y<1$, and $x+y<1$; forming an InAlN layer on the $In_xAl_yGa_{1-(x+y)}N$ layer; and forming a gate recess portion by partly removing the GaN layer, the $In_xAl_yGa_{1-(x+y)}N$ layer, and the InAlN layer; forming ohmic recess portions; forming ohmic electrodes on the ohmic recess portions; and forming a gate electrode over the ohmic recess portions.

The FET with such a structure can produce a good ohmic contact by the InAlGaN layer having a smaller band gap and a higher electron affinity than the InAlN layer, and obtain a higher current density by the polarization of the InAlN layer.

Furthermore, the method may further include forming an AlN layer between the forming of a GaN layer and the forming of an $In_xAl_yGa_{1-(x+y)}N$ layer.

The FET with such a structure can obtain a higher current density with higher electron mobility.

The FET according to the present disclosure can achieve compatibility between a higher current density and lower contact resistance, and exhibits excellent properties.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

(a) to (e) of FIG. 2 illustrate a method for producing a FET according to Embodiment 1.

(a) to (e) of FIG. 4 illustrate a method for producing a FET according to Embodiment 2.

(a) to (d) of FIG. 6 illustrate a method for producing a FET according to Embodiment 3.

(a) to (e) of FIG. 8 illustrate a method for producing a FET according to Embodiment 4.

DETAILED DESCRIPTION OF THE PREFERRED EMBODIMENTS

Embodiment 1

Embodiment 1 according to the present disclosure will be described based on the drawings.

Figure 1:
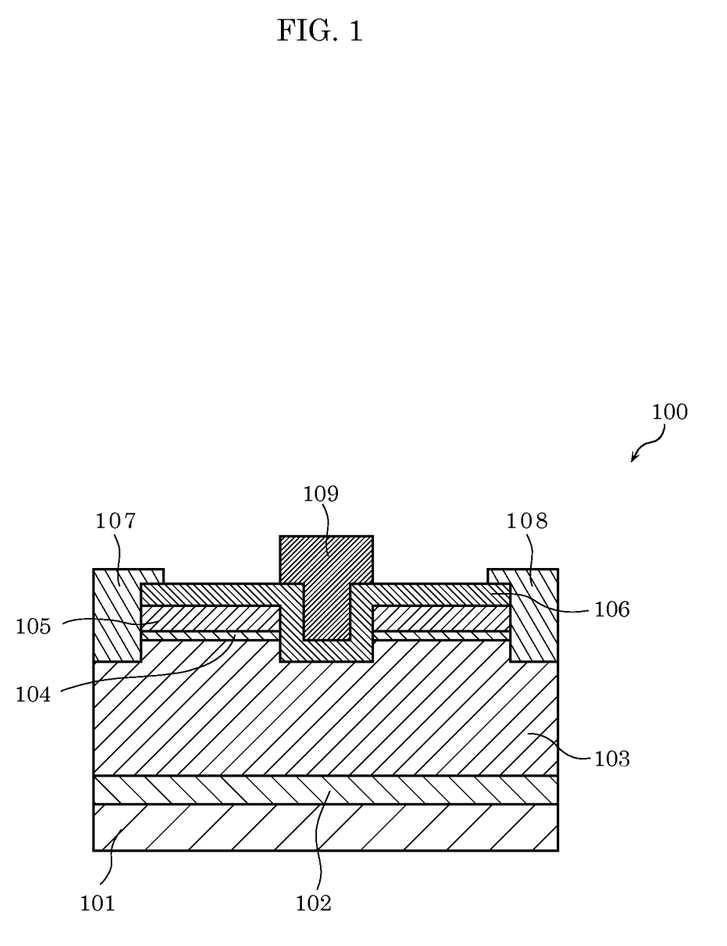
FIG. 1 is a cross-sectional view of a structure of a FET according to Embodiment 1.

FIG. 1 is a cross-sectional view of FET 100 according to Embodiment 1. FET 100 is formed on substrate 101 containing, for example, silicon (Si).

As illustrated in FIG. 1, FET 100 includes: buffer layer 102 including a semiconductor layer; channel layer 103 containing undoped GaN; AlN layer 104 containing undoped AlN; and InAlN layer 105 containing undoped $In_xAl_{1-x}N$ ($0 \leq x < 1$) that are laminated on substrate 101 in this order. Channel layer 103 corresponds to a GaN layer according to the present disclosure.

AlN layer 104 and InAlN layer 105 have an opening with which AlN layer 104 and InAlN layer 105 are partly removed to expose channel layer 103. Furthermore, InAlGaN layer 106 containing undoped $In_yAl_zGa_{1-(y+z)}N$ ($0<y<1$, $0<z<1$, $0<y+z<1$) is laminated to cover channel layer 103 having the exposed opening and the surface of InAlN layer 105.

Source electrode 107 and drain electrode 108 that are in ohmic contact with channel layer 103 are formed on InAlGaN layer 106. Gate electrode 109 that forms a Schottky contact with channel layer 103 is formed between source electrode 107 and drain electrode 108 and on InAlGaN layer 106. Source electrode 107 and drain electrode 108 are ohmic electrodes according to the present disclosure.

In FETs including a barrier layer containing a material having a larger amount of polarity, channel layer 103 can exhibit a higher carrier density. Since channel layer 103 in such FETs largely vary in carrier density when the thickness of the barrier layer is changed, it is difficult to control the threshold voltage ($V_{th}$). This is because $V_{th}$ is a function of a carrier density n as expressed in Expression 1.

$$V_{th} = \theta \cdot \phi_b - e \cdot n \cdot d/\varepsilon - \Delta E_c \quad \text{(Expression 1)}$$

Here, e denotes elementary charge, $\phi_b$ denotes a height of Schottky, d denotes a thickness of a barrier layer, $\varepsilon$ denotes permittivity of the barrier layer, and $\Delta E_c$ denotes a conduction band discontinuity at the interface between the barrier layer and a channel layer.

Since InAlN layer 105 having a larger amount of polarity only at a region below gate electrode 109 is partly removed in FET 100 according to Embodiment 1, the carrier density other than the region has a higher carrier density. Furthermore, since the amount of polarity can vary by changing the composition of InAlGaN layer 106, the threshold voltage of FET 100 can be easily controlled.

FET 100 in FIG. 1 is produced in the following method. (a) to (e) of FIG. 2 illustrate the method of producing FET 100.

Figure 2:
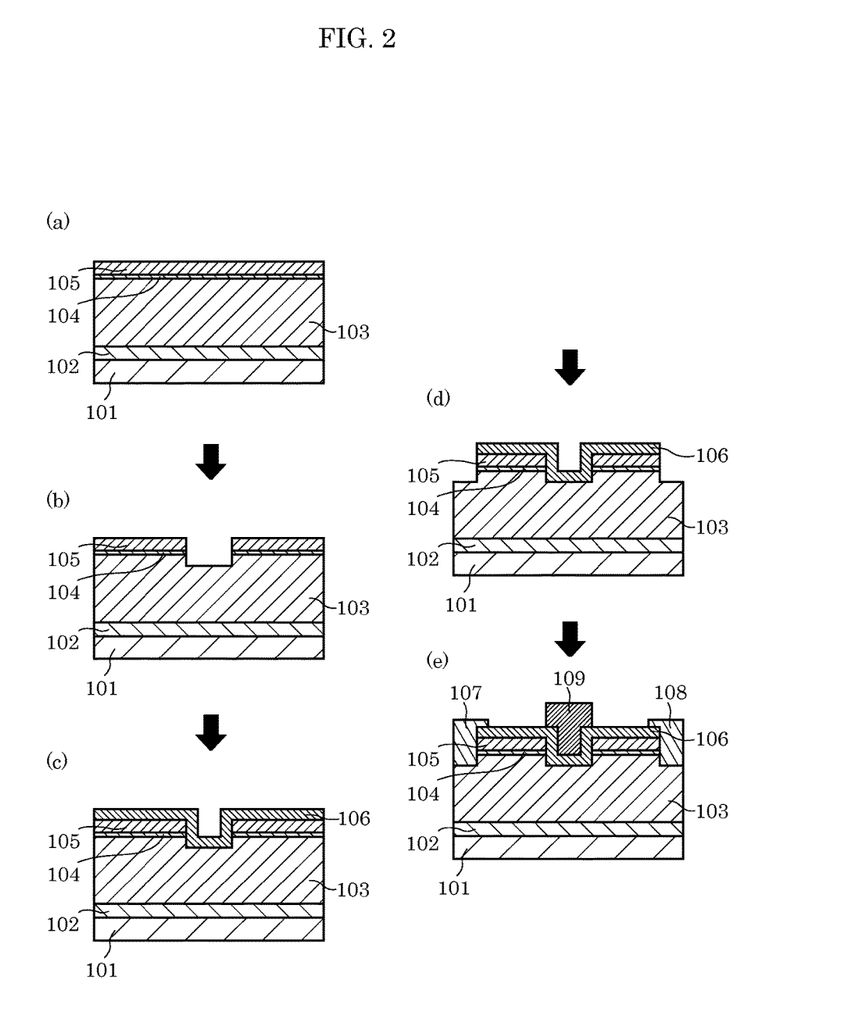

As illustrated in (a) of FIG. 2, in the metal organic chemical vapor deposition (MOCVD), for example, buffer layer 102 containing undoped AlN and undoped AlGaN (400 nm in thickness); channel layer 103 containing undoped GaN (1 μm in thickness); AlN layer 104 containing undoped AlN (1 μm in thickness); and InAlN layer 105 containing undoped $In_{0.18}Al_{0.82}N$ (15 nm in thickness) are sequentially laminated on substrate 101 containing Si. Here, InAlN layer 105 lattice-matches channel layer 103.

Next, a portion of channel layer 103 is exposed to form a gate recess (depressed) portion. First, a photoresist serving as a mask is formed on InAlN layer 105 to form the gate recess portion at a predetermined position. InAlN layer 105 and AlN layer 104 are selectively removed by inductively coupled plasma (ICP) etching using, for example, chlorine ($Cl_2$) gas to form the gate recess portion that is an exposed portion of channel layer 103 ((b) of FIG. 2).

Next, InAlGaN layer 106 containing undoped $In_{0.10}Al_{0.47}Ga_{0.43}N$ (10 μm in thickness) is formed by, for example, MOCVD to cover channel layer 103 that is exposed at the gate recess portion, AlN layer 104, and InAlN layer 105 ((c) of FIG. 2). $In_xAl_yGa_{1-(x+y)}N$ layer 106 satisfies y>4.6x. Here, GaN layer 103 is in contact with InAlGaN layer 106 as illustrated in (c) of FIG. 2.

X in InAlGaN layer 106 may be constant over the layer, or increase with an increase in distance from InAlN layer 105. Such a structure can maintain the parasitic resistance at the interface between InAlN layer 105 and InAlGaN layer 106, and reduce the band gap of InAlGaN layer 106 and increase the electron affinity of InAlGaN layer 106 at the interface between ohmic electrodes (source electrode 107 and drain electrode 108 according to Embodiment 1) to be formed. Thus, the contact resistance can be reduced in FET 100.

Next, channel layer 103 is partly exposed to form ohmic recess portions including source electrode 107 and drain electrode 108. First, a photoresist serving as a mask is formed on InAlGaN layer 106 to form the ohmic recess portions on channel layer 103. InAlGaN layer 106, InAlN layer 105, and AlN layer 104 are selectively removed to form the ohmic recess portions that are exposed portions of channel layer 103 by ICP etching using, for example, $Cl_2$ gas, using the photoresist as a mask ((d) of FIG. 2).

Subsequently after electrically separating the other elements (FET 100) formed on substrate 101, source electrode 107 and drain electrode 108 are formed in contact with channel layer 103, AlN layer 104, and InAlGaN layer 106 in the ohmic recess portions. Source electrode 107 and drain electrode 108 contain, for example, titanium (Ti) and aluminum (Al). Source electrode 107 and drain electrode 108 are formed by, for example, electron-beam evaporation and lift-off. Here, source electrode 107 and drain electrode 108 may be thermally treated at 600° C. in an $N_2$ atmosphere after the formation thereof to further reduce the contact resistance.

Next, gate electrode 109 is formed on InAlGaN layer 106 between source electrode 107 and drain electrode 108. Gate electrode 109 contains nickel (Ni) and gold (Au), and is formed by electron-beam evaporation and lift-off, for example ((e) of FIG. 2). Accordingly, FET 100 in FIG. 1 can be prepared.

FET 100 according to Embodiment 1 can obtain a higher current density by the polarization of InAlN layer 105, and produce a good ohmic contact by InAlGaN layer 106 having a smaller band gap and a higher electron affinity than InAlN layer 105. Furthermore, since the difference in amount of polarity between InAlN layer 105 and InAlGaN layer 106 can be reduced, the parasitic resistance at the interface between InAlN layer 105 and InAlGaN layer 106 can be maintained. Accordingly, the contact resistance of FET 100 can be reduced.

Furthermore, FET 100 can achieve compatibility between a higher current density and lower contact resistance. In addition, a threshold value of FET 100 can be more easily controlled than forming gate electrode 109 above InAlN layer 105 having a larger amount of polarity.

Embodiment 2

Figure 3:
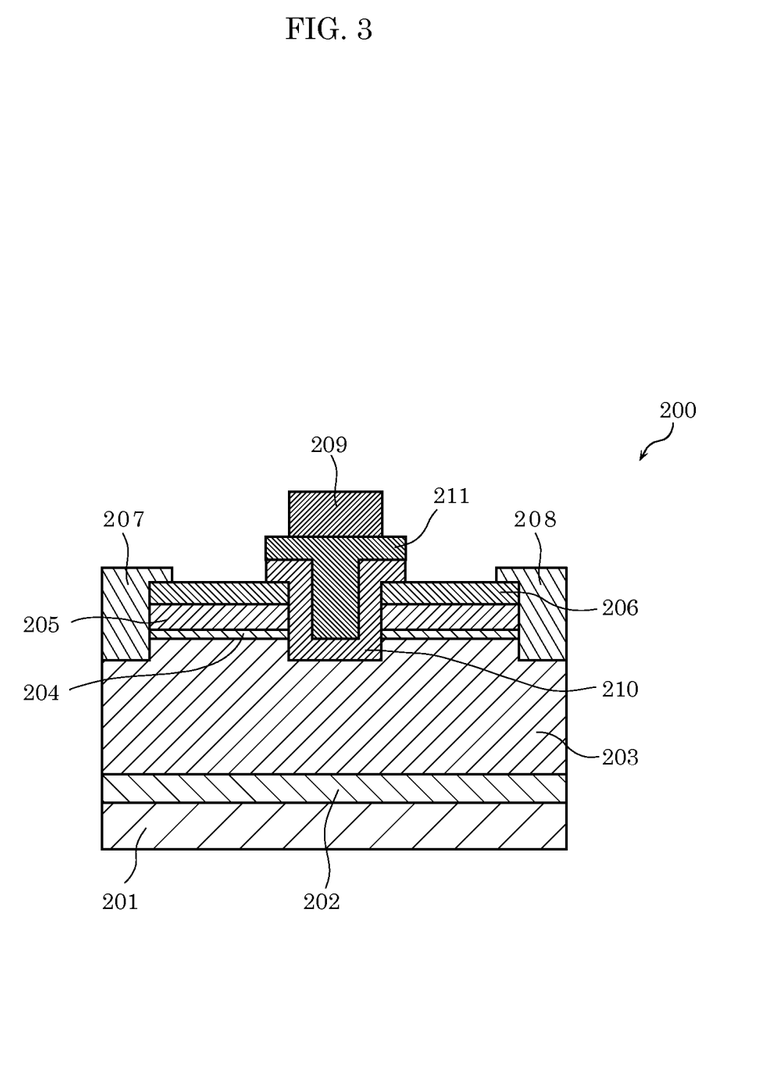
FIG. 3 is a cross-sectional view of a structure of a FET according to Embodiment 2.

Next, FET 200 according to Embodiment 2 of the present disclosure will be described. FET 200 according to Embodiment 2 differs from FET 100 according to Embodiment 1 in formation of an AlGaN layer and a p-type semiconductor layer below a gate electrode.

FIG. 3 is a cross-sectional view of FET 200 according to Embodiment 2. FET 200 is formed on substrate 201 containing, for example, silicon (Si).

FET 200 includes: buffer layer 202 including a semiconductor layer; channel layer 203 containing undoped GaN; AlN layer 204 containing undoped AlN; InAlN layer 205 containing undoped $In_xAl_{1-x}N$ ($0 \leq x < 1$); and undoped $In_yAl_zGa_{1-(y+z)}N$ ($0 < y < 1$, $0 < z < 1$, $0 < y+z < 1$) that are laminated in this order on substrate 201 as illustrated in FIG. 3. Channel layer 203 corresponds to a GaN layer according to the present disclosure.

AlN layer 204, InAlN layer 205, and InAlGaN layer 206 have an opening with which AlN layer 204, InAlN layer 205 and InAlGaN layer 206 are partly removed to expose channel layer 203. Furthermore, AlGaN layer 210 containing undoped $Al_sGa_{1-s}N$ ($0 < s \leq 1$) and p-type semiconductor layer 211 having a p-type conductivity and containing GaN are laminated in the opening in this order to partly cover exposed channel layer 203 and InAlGaN layer 206.

According to the present disclosure, AlGaN layer 210 corresponds to a first semiconductor layer, and p-type semiconductor layer 211 corresponds to a second semiconductor layer.

Source electrode 207 and drain electrode 208 that are in ohmic contact with channel layer 203 are formed on InAlGaN layer 206. Furthermore, gate electrode 209 is formed on and in ohmic contact with p-type semiconductor layer 211. Source electrode 207 and drain electrode 208 are ohmic electrodes according to the present disclosure.

AlGaN has an amount of polarity smaller than those of InAlN and InAlGaN as described above. Thus, a threshold voltage of FET 200 can be more easily controlled with AlGaN layer 210. Furthermore, the electric potential of gate electrode 209 increases with p-type semiconductor layer 211 on AlGaN layer 210 in FET 200. Here, since carriers of channel layer 203 below gate electrode 209 are depleted when no positive voltage is applied to the gate, enhancement-mode FET 200 can be achieved.

FET 200 in FIG. 3 is produced in the following method. (a) to (e) of FIG. 4 illustrate the method of producing FET 200.

Figure 4:
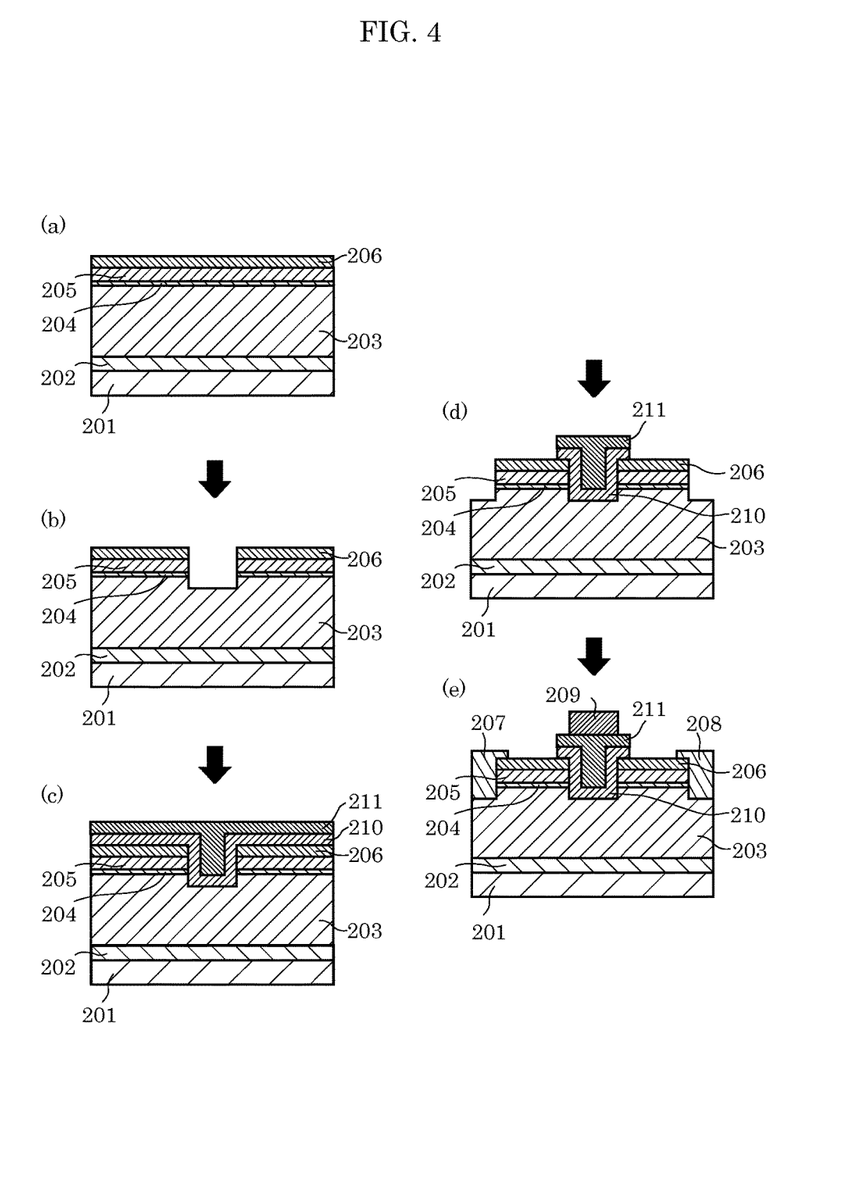

As illustrated in (a) of FIG. 4, in MOCVD, for example, buffer layer 202 containing undoped AlN and undoped AlGaN (400 nm in thickness); channel layer 203 containing undoped GaN (1 μm in thickness); AlN layer 204 containing undoped AlN (1 μm in thickness); InAlN layer 205 containing undoped $In_{0.18}Al_{0.82}N$ (15 nm in thickness); and InAlGaN layer 206 containing undoped $In_{0.10}Al_{0.60}Ga_{0.30}N$ (30 μm in thickness) are sequentially laminated on substrate 201 containing Si.

Next, a portion of channel layer 203 is exposed to form a gate recess portion. First, a photoresist serving as a mask is formed on InAlGaN layer 206 to form the gate recess portion at a predetermined position. InAlGaN layer 206, InAlN layer 205, and AlN layer 204 are selectively removed to form the gate recess portion that is an exposed portion of channel layer 203 by ICP etching using, for example, $Cl_2$ gas using the photoresist serving as a mask ((b) of FIG. 4).

Subsequently, for example, AlGaN layer 210 containing undoped $Al_{0.15}Ga_{0.85}N$ (20 nm in thickness) and p-type semiconductor layer 211 containing GaN to which magnesium (Mg) is added (200 nm in thickness) are sequentially laminated by MOCVD to cover channel layer 203 that is exposed at the gate recess portion, AlN layer 204, InAlN layer 205, and InAlGaN layer 206 ((c) of FIG. 4). Here, GaN layer 203 is in contact with AlGaN layer 210 as illustrated in (c) of FIG. 4.

X in InAlGaN layer 206 may be constant over the layer, or increase with an increase in distance from InAlN layer 205.

Next, channel layer 203 is partly exposed to form ohmic recess portions including source electrode 207 and drain electrode 208. First, a photoresist serving as a mask is formed on InAlGaN layer 206 to form the ohmic recess portions on channel layer 203. P-type semiconductor layer 211 and AlGaN layer 210 are selectively removed by ICP etching using, for example, $Cl_2$ gas using the photoresist serving as a mask. Then, InAlGaN layer 206, InAlN layer 205, and AlN layer 204 are again patterned using the photoresist and selectively removed to form the ohmic recess portions that are exposed portions of channel layer 203 ((d) of FIG. 4).

Subsequently after electrically separating the other elements (FET 200) formed on substrate 201, source electrode 207 and drain electrode 208 are formed in contact with channel layer 203, AlN layer 204, and InAlGaN layer 206 in the ohmic recess portions. Source electrode 207 and drain electrode 208 contain, for example, titanium (Ti) and aluminum (Al). Source electrode 207 and drain electrode 208 are formed by, for example, electron-beam evaporation and lift-off. Here, source electrode 207 and drain electrode 208 may be thermally treated at 600° C. in an $N_2$ atmosphere after the formation thereof to further reduce the contact resistance.

Next, gate electrode 209 is formed in contact with p-type semiconductor layer 211. Gate electrode 209 contains nickel (Ni) and gold (Au), and is formed by electron-beam evaporation and lift-off, for example ((e) of FIG. 4). Accordingly, FET 200 in FIG. 3 can be prepared. An insulating film may be disposed between gate electrode 209 and p-type semiconductor layer 211.

Although p-type semiconductor layer 211 contains GaN to which Mg is added according to Embodiment 2, p-type semiconductor layer 211 may contain the other materials such as AlGaN, InGaN, or InN.

FET 200 can achieve compatibility between a higher current density and lower contact resistance. In addition, a threshold value of FET 200 can be more easily controlled than forming gate electrode 209 above InAlN layer 205 having a larger amount of polarity.

Furthermore, FET 200 in enhancement mode required by power devices can be achieved with formation of p-type semiconductor layer 211 having a p-type conductivity, between gate electrode 209 and AlGaN layer 210 that is the first semiconductor layer.

Embodiment 3

Figure 5:
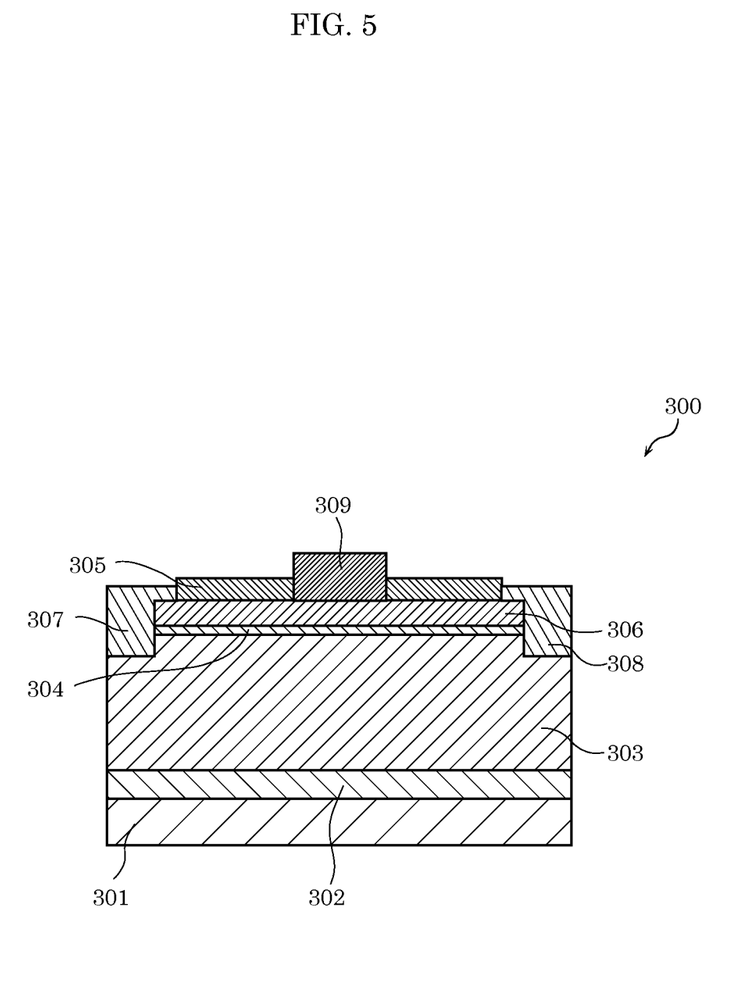
FIG. 5 is a cross-sectional view of a structure of a FET according to Embodiment 3.

Next, FET 300 according to Embodiment 3 of the present disclosure will be described. FET 300 according to Embodiment 3 differs from FET 100 according to Embodiment 1 in that an InAlGaN layer below a gate electrode is not in contact with a channel layer.

FIG. 5 is a cross-sectional view of FET 300 according to Embodiment 3. FET 300 is formed on substrate 301 containing, for example, silicon (Si). As illustrated in FIG. 5, FET 300 includes: buffer layer 302 including a semiconductor layer; channel layer 303 containing undoped GaN; AlN layer 304 containing undoped AlN; InAlGaN layer 306 containing undoped $In_yAl_zGa_{1-(y+z)}N$ (0<y<1, 0<z<1, 0<y+z<1); and InAlN layer 305 containing undoped $In_xAl_{1-x}N$ (0≤x<1) that are laminated in this order on substrate 301. Channel layer 303 corresponds to a GaN layer according to the present disclosure.

InAlN layer 305 has openings with which InAlN layer 305 is partly removed to expose InAlGaN layer 306. Furthermore, the inner regions of the openings have ohmic recess portions obtained by selectively removing InAlGaN layer 306 to expose channel layer 303. Furthermore, InAlN layer 305 has a gate recess portion obtained by selectively removing InAlN layer 305 to expose InAlGaN layer 306 in a region different from the openings.

In the ohmic recess portion, source electrode 307 and drain electrode 308 that are in ohmic contact with channel layer 303 are formed in contact with channel layer 303 and InAlGaN layer 306. Furthermore, gate electrode 309 that forms a Schottky contact with InAlGaN layer 306 is formed in the gate recess portion. Source electrode 307 and drain electrode 308 are ohmic electrodes according to the present disclosure.

FET 300 in FIG. 5 is produced in the following method. (a) to (d) of FIG. 6 illustrate the method of producing FET 300.

Figure 6:
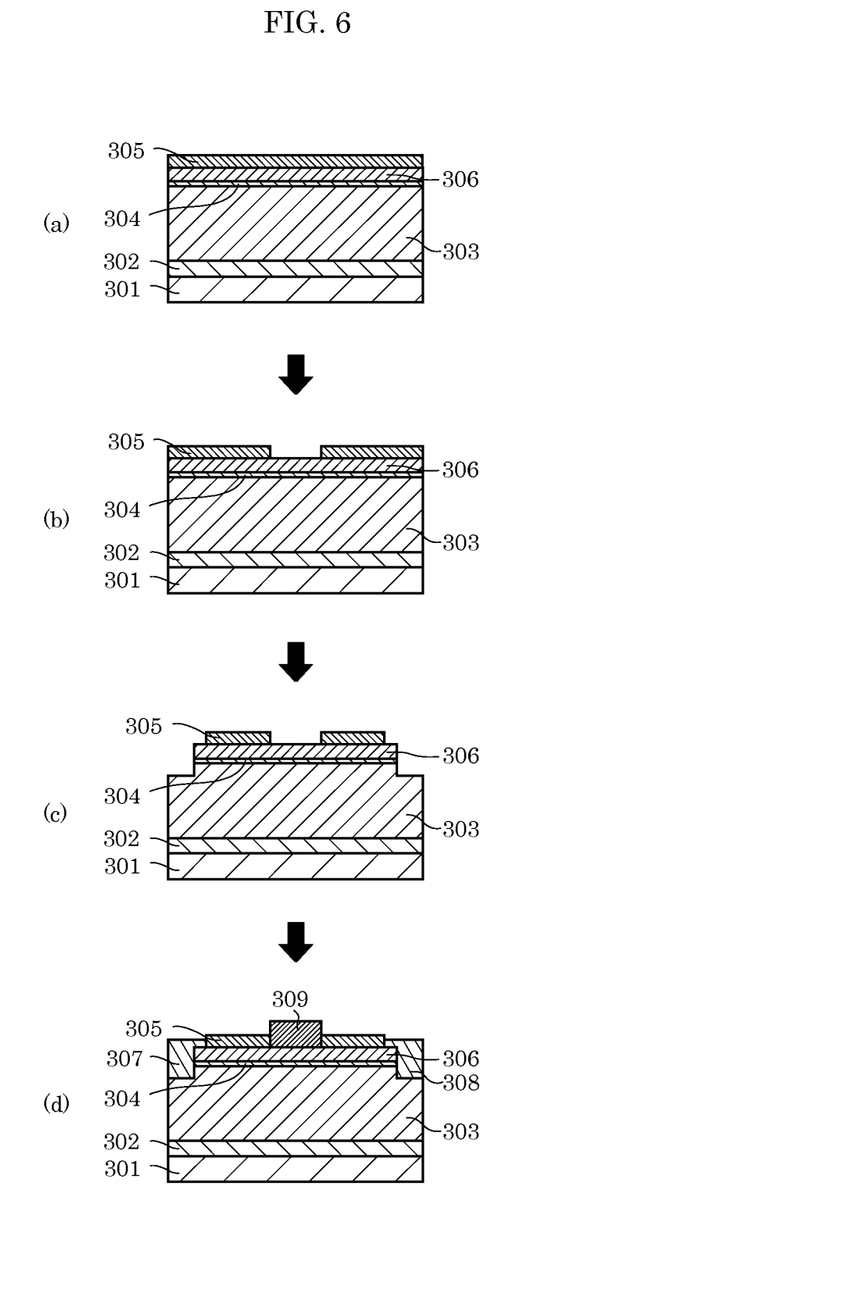

For example, as illustrated in (a) of FIG. 6, by MOCVD, buffer layer 302 containing undoped AlN and undoped AlGaN (400 nm in thickness); channel layer 303 containing undoped GaN (1 μm in thickness); AlN layer 304 containing undoped AlN (1 μm in thickness); InAlGaN layer 306 containing undoped $In_{0.08}Al_{0.37}Ga_{0.55}N$ (5 μm in thickness); and InAlN layer 305 containing undoped $In_{0.18}Al_{0.82}N$ (15 nm in thickness) are sequentially laminated on substrate 301 containing Si.

Next, a portion of InAlGaN layer 306 is exposed to form a gate recess portion. First, a photoresist serving as a mask is formed on InAlN layer 305 to form the gate recess portion at a predetermined position. Then, InAlN layer 305 is selectively removed to form the gate recess portion that is an exposed portion of InAlGaN layer 306 by ICP etching using, for example, $Cl_2$ gas using the photoresist serving as a mask ((b) of FIG. 6).

Next, channel layer 303 is partly exposed to form ohmic recess (depressed) portions in portions different from the gate recess portion. First, a photoresist serving as a mask is formed on InAlN layer 305 to form the ohmic recess portions at predetermined positions. Openings are formed in InAlN layer 305 using this photoresist as a mask so that InAlGaN layer 306 is exposed at the portions different from the gate recess portion. Furthermore, the ohmic recess portions are formed in the inner regions of the openings by selectively removing InAlGaN layer 306 and AlN layer 304 to partly expose channel layer 303 ((c) of FIG. 6).

Subsequently after electrically separating the other elements (FET 300) formed on substrate 301, source electrode 307 and drain electrode 308 are formed in contact with channel layer 303 and InAlGaN layer 306 in the ohmic recess portions. Source electrode 307 and drain electrode 308 contain, for example, titanium (Ti) and aluminum (Al).

Source electrode 307 and drain electrode 308 are formed by, for example, electron-beam evaporation and lift-off. Here, source electrode 307 and drain electrode 308 may be thermally treated at 600° C. in an $N_2$ atmosphere after the formation thereof to further reduce the contact resistance.

Next, gate electrode 309 containing nickel (Ni) and gold (Au) is formed at the gate recess portion on InAlGaN layer 306 by, for example, electron-beam evaporation and lift-off ((d) of FIG. 6). Accordingly, FET 300 in FIG. 5 can be prepared after formation of source electrode 307 and drain electrode 308.

FET 300 according to Embodiment 3 can obtain a higher current density by the polarization of InAlN layer 305, and produce a good ohmic contact by InAlGaN layer 306 having a smaller band gap and a higher electron affinity than InAlN layer 305.

Furthermore, a threshold value of FET 300 can be more easily controlled with the composition of InAlGaN layer 306 in addition to obtainment of a higher current density by the polarization of InAlN layer 305. Furthermore, FET 300 can obtain a higher current density with higher electron mobility.

Embodiment 4

Figure 7:
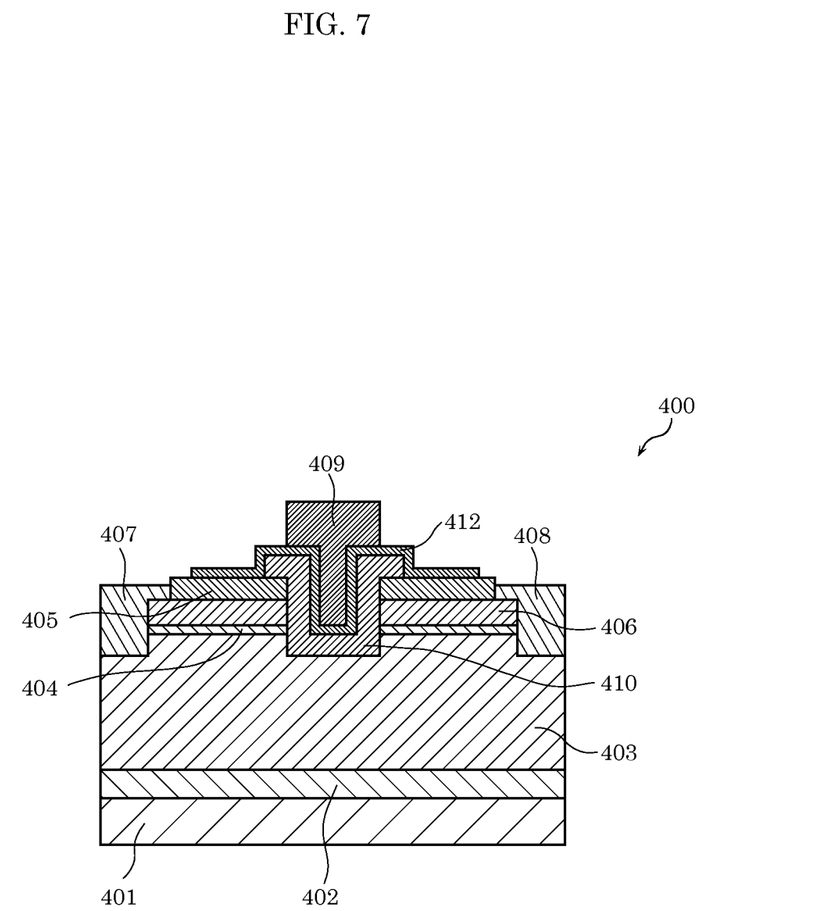
FIG. 7 is a cross-sectional view of a structure of a FET according to Embodiment 4.

Next, FET 400 according to Embodiment 4 of the present disclosure will be described. FET 400 according to Embodiment 4 differs from FET 100 according to Embodiment 1 in formation of an AlGaN layer and an insulating film below a gate electrode.

FIG. 7 is a cross-sectional view of FET 400 according to Embodiment 4. FET 400 is formed on substrate 401 containing, for example, silicon (Si).

As illustrated in FIG. 7, FET 400 includes: buffer layer 402 including a semiconductor layer; channel layer 403 containing undoped GaN;

AlN layer 404 containing undoped AlN; InAlGaN layer 406 containing undoped $In_yAl_zGa_{1-(y+z)}N$ (0<y<1, 0<z<1, 0<y+z<1); and InAlN layer 405 containing undoped $In_xAl_{1-x}N$ (0≤x<1) that are laminated in this order on substrate 401. Channel layer 403 corresponds to a GaN layer according to the present disclosure.

InAlN layer 405 has openings with which InAlN layer 405 is partly removed to expose InAlGaN layer 406. Furthermore, ohmic recess portions are formed in the inner regions of the openings by selectively removing InAlGaN layer 406 to expose channel layer 403.

Furthermore, AlN layer 404, InAlN layer 405, and InAlGaN layer 406 have a gate recess portion that is partly removed to expose channel layer 403.

Furthermore, AlGaN layer 410 containing undoped $Al_sGa_{1-s}N$ (0<s≤1) is laminated to partly cover the gate recess portion and InAlN layer 405.

In the ohmic recess portions, source electrode 407 and drain electrode 408 that are in ohmic contact with channel layer 403 are formed in contact with channel layer 403 and InAlGaN layer 406. Furthermore, insulating film 412 containing $Al_2O_3$ is laminated on AlGaN layer 410. Furthermore, gate electrode 409 is formed on insulating film 412. Insulating film 412 directly below gate electrode 409 can significantly reduce the leakage current. Source electrode 407 and drain electrode 408 are ohmic electrodes according to the present disclosure.

Figure 8:
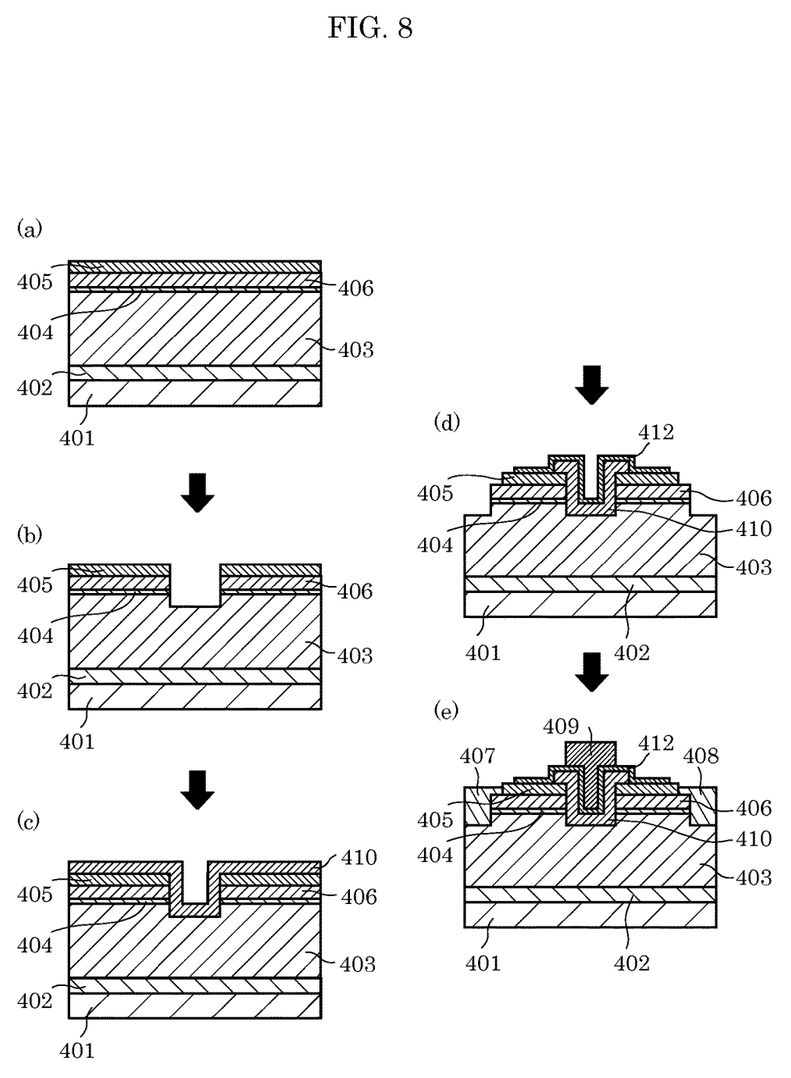

FET 400 in FIG. 7 is produced in the following method. (a) to (e) of FIG. 8 illustrate the method of producing FET 400. For example, by MOCVD, buffer layer 402 containing undoped AlN and undoped AlGaN (400 nm in thickness); channel layer 403 containing undoped GaN (1 μm in thickness); AlN layer 404 containing undoped AlN (1 µm in thickness); InAlGaN layer 406 containing undoped In$_{0.08}$Al$_{0.50}$Ga$_{0.42}$N (5 µm in thickness); and InAlN layer 405 containing undoped In$_{0.18}$Al$_{0.82}$N (15 nm in thickness) are sequentially laminated on substrate 401 containing Si ((a) of FIG. 8).

Next, a portion of channel layer 403 is exposed to form a gate recess portion. First, a photoresist serving as a mask is formed on InAlN layer 405 to form the gate recess portion at a predetermined position. InAlN layer 405, InAlGaN layer 406, and AlN layer 404 are selectively removed to form the gate recess portion that is an exposed portion of channel layer 403 by ICP etching using, for example, Cl$_2$ gas using the photoresist serving as a mask ((b) of FIG. 8).

Next, AlGaN layer 410 containing undoped Al$_{0.15}$Ga$_{0.85}$N (20 µm in thickness) is formed by, for example, MOCVD to cover channel layer 403 that is exposed at the gate recess portion, AlN layer 404, InAlN layer 405, and InAlGaN 406 ((c) of FIG. 8).

Next, channel layer 403 is partly exposed to form ohmic recess portions. First, a photoresist serving as a mask is formed on InAlN layer 405 to form the ohmic recess portions at predetermined positions. After selectively removing AlGaN layer 410 by, for example, ICP etching using Cl$_2$ gas using the photoresist as a mask, insulating film 412 (10 µm in thickness) containing alumina (Al$_2$O$_3$) is formed on InAlN layer 405 and AlGaN layer 410 by an atomic layer deposition (ALD) method.

Next, InAlN layer 405 is partly exposed by selectively etching insulating film 412 using, for example, hydrofluoric acid (HF) and the photoresist as the mask. Then, openings are formed by further partly removing exposed InAlN layer 405 to expose InAlGaN layer 406 by, for example, ICP etching using Cl$_2$ gas using the photoresist as the mask. Subsequently, the ohmic recess portions are formed by selectively removing InAlGaN layer 406 to partly expose channel layer 403 in the inner regions of the openings, using the photoresist as the mask ((d) of FIG. 8).

Subsequently after electrically separating the other elements (FET 400) formed on substrate 401, source electrode 407 and drain electrode 408 are formed in contact with channel layer 403 and InAlGaN layer 406 at the ohmic recess portions. Source electrode 407 and drain electrode 408 contain, for example, titanium (Ti) and aluminum (Al). Source electrode 407 and drain electrode 408 are formed by, for example, electron-beam evaporation and lift-off. Here, source electrode 407 and drain electrode 408 may be thermally treated, for example, at 600° C. in an N$_2$ atmosphere to further reduce the contact resistance.

Next, gate electrode 409 containing nickel (Ni) and gold (Au) is formed in the gate recess portion above InAlGaN layer 406 by, for example, electron-beam evaporation and lift-off ((e) of FIG. 8). Accordingly, FET 400 in FIG. 7 can be prepared.

FET 400 according to Embodiment 4 can reduce the leakage current using gate electrode 409, and has excellent properties.

Although FETs according to the present disclosure are described based on Embodiments 1 to 4, the present disclosure is not limited to these Embodiments. The present disclosure includes various modifications that may be conceived by those skilled in the art which do not depart from the gist of the present disclosure. Furthermore, the present disclosure may include an arbitrary combination of the constituent elements in Embodiments without departing from the gist of the present disclosure.

Although substrates 101, 201, 301, and 401 contain Si according to Embodiments 1 to 4, substrates 101, 201, 301, and 401 may be dissimilar substrates containing SiC, sapphire, zinc oxide (ZnO), and zirconium boride (ZrB$_2$), or group III-V nitride semiconductor substrates such as GaN and AlN.

Furthermore, the formation of AlN layer 404 may be omitted.

Although insulating film 412 contains Al$_2$O$_3$ deposited by the ALD method according to Embodiments 1 to 4, it may contain, for example, silicon nitride (Si$_3$N$_4$), silicon oxide (SiO$_2$), or aluminum nitride (AlN), and may be deposited using MOCVD or plasma-assisted chemical vapor deposition (PCVD).

The FET epitaxial layers herein may have any composition ratio and any multi-layered structure as long as they can achieve desired device properties. Some of the epitaxial layers may be grown by not MOCVD but, for example, molecular beam epitaxy (MBE) or hydride vapor phase epitaxy (HYPE).

Furthermore, the present disclosure is applicable to diodes each including two electrodes of a Schottky electrode and an ohmic electrode.

The FETs and methods for producing the FETs according to Embodiments 1 to 4 can significantly reduce the parasitic resistance.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The FETs according to the present disclosure are useful as radio frequency devices, switching power supplies, and inverters for, for example, millimeter wave communications, or as power devices in power circuits for other consumer appliances including televisions, such as motor drivers.

The invention claimed is:

1. A field-effect transistor comprising:
a GaN layer above a substrate;
an InAlN layer above the GaN layer;
an In$_x$Al$_y$Ga$_{1-(x+y)}$N layer on the InAlN layer, where 0<x<1, 0<y<1, and x+y<1; and
ohmic electrodes forming ohmic contact with the In$_x$Al$_y$Ga$_{1-(x+y)}$N layer, and
a gate electrode over the In$_x$Al$_y$Ga$_{1-(x+y)}$N layer,
wherein the GaN layer is in contact with the In$_x$Al$_y$Ga$_{1-x+y)}$N layer in a region below the gate electrode.

2. The field-effect transistor according to claim 1, further comprising an AlN layer between the InAlN layer and the GaN layer.

3. The field-effect transistor according to claim 1, wherein x of the In$_x$Al$_y$Ga$_{1-(x+y)}$N layer increases with an increase in distance from the InAlN layer.

4. The field-effect transistor according to claim 1,
wherein the InAlN layer and the In$_x$Al$_y$Ga$_{1-(x+y)}$N layer have an opening, and
the field-effect transistor further comprises: a first semiconductor layer on the GaN layer that is exposed through the opening, the first semiconductor layer comprising a material having an amount of polarity smaller than an amount of polarity of the $In_xAl_yGa_{1-(x+y)}N$ layer; and the gate electrode is disposed above the first semiconductor layer.

5. The field-effect transistor according to claim 4, further comprising a second semiconductor layer between the first semiconductor layer and the gate electrode, the second semiconductor layer having a p-type conductivity.

6. The field-effect transistor according to claim 5, wherein the second semiconductor layer comprises GaN.

7. The field-effect transistor according to claim 5, further comprising an insulating film between the second semiconductor layer and the gate electrode.

8. The field-effect transistor according to claim 4, wherein the first semiconductor layer comprises AlGaN.

9. The field-effect transistor according to claim 4, further comprising an insulating film between the first semiconductor layer and the gate electrode.

10. The field-effect transistor according to claim 1, wherein the InAlN layer and the $In_xAl_yGa_{1-(x+y)}N$ layer have an opening, and the field-effect transistor further comprises an insulating film, the gate electrode being disposed through the insulating film above the GaN layer that is exposed through the opening.

11. The field-effect transistor according to claim 1, wherein the InAlN layer lattice-matches the GaN layer.

12. The field-effect transistor according to claim 1, wherein the $In_xAl_yGa_{1-(x+y)}N$ layer satisfies y>4.6x.

13. The field-effect transistor according to claim 1, further comprising a p-type semiconductor layer between the $In_xAl_yGa_{1-(x+y)}N$ layer and the gate electrode.

14. The field-effect transistor according to claim 13, wherein the p-type semiconductor layer comprises GaN.

15. The field-effect transistor according to claim 13, further comprising an insulating film between the p-type semiconductor layer and the gate electrode.

16. The field-effect transistor according to claim 1, further comprising
an insulating film between the $In_xAl_yGa_{1-(x+y)}N$ layer and the gate electrode.

17. A field-effect transistor comprising:
a GaN layer above a substrate;
an InAlN layer above the GaN layer;
an $In_xAl_yGa_{1-(x+y)}N$ layer on the InAlN layer, where $0<x<1$, $0<y<1$, and $x+y<1$; and
ohmic electrodes on the $In_xAl_yGa_{1-(x+y)}N$ layer,
wherein the InAlN layer and the $In_xAl_yGa_{1-(x+y)}N$ layer have an opening, and
the field-effect transistor further comprises:
a first semiconductor layer on the GaN layer that is exposed through the opening, the first semiconductor layer comprising a material having an amount of polarity smaller than an amount of polarity of the $In_xAl_yGa_{1-(x+y)}N$ layer;
a gate electrode above the first semiconductor layer, and
an insulating film between the first semiconductor layer and the gate electrode, and
wherein the first semiconductor layer covers both of a bottom surface and a side surface of the opening.

18. The field-effect transistor according to claim 17, wherein the first semiconductor layer is in direct contact with the $In_xAl_yGa_{1-(x+y)}N$ layer.

19. A field-effect transistor comprising:
a GaN layer above a substrate;
an InAlN layer above the GaN layer;
an $In_xAl_yGa_{1-(x+y)}N$ layer on the InAlN layer, where $0<x<1$, $0<y<1$, and $x+y<1$; and
ohmic electrodes on the $In_xAl_yGa_{1-(x+y)}N$ layer,
wherein the InAlN layer and the $In_xAl_yGa_{1-(x+y)}N$ layer have an opening, and
the field-effect transistor further comprises:
a first semiconductor layer on the GaN layer that is exposed through the opening, the first semiconductor layer comprising a material having an amount of polarity smaller than an amount of polarity of the $In_xAl_yGa_{1-(x+y)}N$ layer;
a gate electrode above the first semiconductor layer,
a second semiconductor layer between the first semiconductor layer and the gate electrode, the second semiconductor layer having a p-type conductivity, and
an insulating film between the second semiconductor layer and the gate electrode.

* * * * *